United States Patent [19]
Matsumiya et al.

[11] Patent Number: 5,943,253
[45] Date of Patent: Aug. 24, 1999

[54] SEMICONDUCTOR MEMORY DEVICE WITH EFFICIENT LAYOUT

[75] Inventors: Masato Matsumiya; Satoshi Eto; Toshikazu Nakamura; Masato Takita, all of Kawasaki; Mitsuhiro Higashiho, Kasugai; Toru Koga, Kawasaki; Hideki Kano, Kawasaki; Ayako Kitamoto, Kawasaki; Kuninori Kawabata, Kawasaki, all of Japan

[73] Assignee: Fujitsu Limited, Kanagawa, Japan

[21] Appl. No.: 09/057,449

[22] Filed: Apr. 9, 1998

[30] Foreign Application Priority Data

Apr. 15, 1997 [JP] Japan .................................... 9-097680

[51] Int. Cl.⁶ ........................................................ G11C 5/06
[52] U.S. Cl. ................................................. 365/63; 365/51
[58] Field of Search ............................ 365/63, 51, 230.03

[56] References Cited

U.S. PATENT DOCUMENTS 5,499,215   3/1996   Halta .......................................... 365/63
5,546,349   8/1996   Watanabe et al. ........................ 365/63
5,657,265   8/1997   Yoo et al. .................................. 365/63
5,838,604   11/1998  Tsuboi et al. ............................. 365/62

FOREIGN PATENT DOCUMENTS 2-246091   10/1990   Japan .

*Primary Examiner*—Son T. Dinh
*Attorney, Agent, or Firm*—Nikaido Marmelstein Murray & Oram, LLP

[57] ABSTRACT

A semiconductor memory device includes at least one cell block including an array of memory cells, a plurality of sense amplifiers which temporarily hold data of the memory cells, a first data bus connected to the plurality of sense amplifiers via first gates, and a second data bus having a direct electrical connection to the first data bus and being laid out to extend through a position of the at least one cell block.

14 Claims, 11 Drawing Sheets

SEMICONDUCTOR MEMORY DEVICE WITH EFFICIENT LAYOUT

BACKGROUND OF THE INVENTION

1. Field of the Invention

The present invention generally relates to semiconductor memory devices, and particularly relates to a semiconductor memory device such as a DRAM which stores data in a cell array thereof.

2. Description of the Related Art

In semiconductor memory devices such as DRAMs, memory cells, each of which is capable of storing 1 bit of data, are grouped into a plurality of blocks, and data is written in or read from a memory cell array of each of these blocks. FIG. 1 is an illustrative drawing showing a layout of cell arrays and peripherals thereof with regard to a related-art DRAM.

A DRAM of FIG. 1 includes a core circuit 201 and global data buses 202 for reading data from and writing data in the core circuit 201. The core circuit 201 includes cell blocks 210, sense-amplifier-line areas 211, sub-word-decoder-line areas 212, local data buses 213, a word-selection line 214, a column-selection line 215, and amplifier switches 216. The cell blocks 210 are arranged in rows and columns, and include cell arrays. The sense-amplifier-line areas 211 are provided alongside the cell blocks 210 on either one of an upper side and a lower side thereof. The sub-word-decoder-line areas 212 are positioned alongside the cell blocks 210 on either one of a left-hand side and a right-hand side. The local data buses 213 are laid out over the sense-amplifier-line areas 211. The word-selection line 214 selects a row of memory cells in the cell blocks 210. The column-selection line 215 selects some of sense amplifiers (not shown) which are arranged in the sense-amplifier-line areas 211. The amplifier switches 216 connects the local data buses 213 to the global data buses 202.

Operations of the DRAM of FIG. 1 will be described below by taking a data-read operation as an example. The word-selection line 214 is first selected from a plurality of word-selection lines (not shown) by word decoders (not shown) arranged in the sub-word-decoder-line areas 212. The selection of the word-selection line 214 is equivalent to selecting one row of the cell blocks 210 from the rows and columns of the cell blocks 210, and further selecting a row of memory cells from the cell arrays in the selected row of the cell blocks 210. Data stored in the selected memory cells is transferred via bit lines (not shown) to the sense amplifiers provided in the sense-amplifier-line areas 211 which are arranged on the upper side and the lower side of the selected cell blocks 210. The column-selection line 215 is selected from a plurality of column-selection lines (not shown) to choose some sense amplifiers from the plurality of sense amplifiers, which store the data transferred from the memory cells. The data is read from the selected sense amplifiers to the local data buses 213. The amplifier switches 216 are operated to connect the global data buses 202 to the local data buses 213 which are situated on the upper side and the lower side of the selected cell blocks 210. This allows the global data buses 202 to read data from the local data buses 213.

In the related-art DRAM having such a layout as described above, spaces need to be provided on either side of the core circuit 201 to accommodate the global data buses 202. Providing such spaces entails an increase in a chip size, and, thus, is not desirable. Further, the amplifier switches 216 for connecting between the global data buses 202 and the local data buses 213 are bound to have some resistance. The problem is that this resistance slows data-transfer speed.

FIG. 2 is an illustrative drawing showing another layout of cell arrays and peripherals thereof with regard to a related-art DRAM.

In FIG. 2, the same elements as those of FIG. 1 are referred to by the same numerals, and a description thereof will be omitted. In a DRAM of FIG. 2, global data buses 202A are positioned on either side of each columns of the cell blocks 210, which are arranged in rows and columns inside a core circuit 201A. The local data buses 213 are connected to the global data buses 202A via amplifier switches 216A, which are provided at intersections between the local data buses 213 and the global data buses 202A.

In the layout of FIG. 2, the global data buses 202A are overlaid on the sub-word-decoder-line areas 212, so that there is no need to provide spaces dedicated for the global data buses as shown in FIG. 1. The layout, however, is relatively complex in that the global data buses 202A, the amplifier switches 216A, and circuits (not shown) for driving the amplifier switches 216A need to be arranged over the sub-word-decoder-line areas 212.

Further, there is a serious problem which are shared by both the layout of FIG. 1 and the layout of FIG. 2. The problem is that since the global data buses 202 or 202A are laid out within a limited small space, a limitation is placed on the number of the global data buses which can be laid out. Namely, there is a size limit to available chip areas, so that it is difficult to step up the volume of data transfer by increasing the number of global data buses.

Accordingly, there is a need for a semiconductor memory device which can step up the volume of data transfer by increasing the number of global data buses without enlarging a chip size.

SUMMARY OF THE INVENTION

Accordingly, it is general object of the present invention to provide a semiconductor memory device which can satisfy the need described above.

It is another and more specific object of the present invention to provide a semiconductor memory device which can step up the volume of data transfer by increasing the number of global data buses without enlarging a chip size.

In order to achieve the above objects, a semiconductor memory device according to the present invention includes at least one cell block including an array of memory cells, a plurality of sense amplifiers which temporarily hold data of the memory cells, a first data bus connected to the plurality of sense amplifiers via first gates, and a second data bus having a direct electrical connection to the first data bus and being laid out to extend through a position of the at least one cell block.

In the semiconductor memory device described above, the second data bus, which serves as a global data bus, is laid out through a position of the cell block, so that a data transfer rate can be enhanced by increasing the number of global data buses without enlarging chip size.

According to one aspect of the present invention, the first data bus and the second data bus are provided in different wiring layers, so that these buses can be laid out without posing layout restrictions on each other.

According to another aspect of the present invention, first selection lines serving as word-selection lines are provided in a first wiring layer, and can extend perpendicularly to the second data bus which is provided in a second wiring layer.

According to another aspect of the present invention, second selection lines serving as column-selection lines selectively connect at least one of the sense amplifiers to the first data bus.

According to another aspect of the present invention, first data buses serving as local data buses have one-to-one direct connections to second data buses serving as global data buses, so that data-read/write operations can be conducted with respect to a given local data bus by using a corresponding global data bus.

According to another aspect of the present invention, the second data bus serving as the global data bus has one-to-many direct connections to first data buses serving as local data buses, so that the number of global data buses is relatively small compared to the case of the one-to-one direct connections.

According to another aspect of the present invention, when the second data bus has the one-to-many connections to the first data bus, one of the sense-amplifier lines is selected so as to be connected to a corresponding one of the first data buses. Such selection control can prevent data of the local data buses from colliding with each other on the global data bus.

According to another aspect of the present invention, third selection lines serving as sense-amplifier-selection lines are provided in a wiring layer different from that of the second selection lines serving as the column-selection lines, so that both lines can be laid out without posing layout restrictions on each other.

According to another aspect of the present invention, two gates are connected in series, and controlled by a second selection line and a third selection line. This simple circuit achieves connection control such that a selected one of the sense amplifiers is connected to the first data bus only when both the second selection line and the third selection line are activated.

According to another aspect of the present invention, a direct-sense-amplifier scheme is employed with regard to data-read operations, thereby achieving reliable data-read operations.

According to another aspect of the present invention, a voltage of a second selection line serving as a column-selection line is generally lower than a pre-charge voltage level when the second selection line is selected. In this configuration, the first gates serving as column gates do not open even when they are selected as long as the sense amplifiers keep the pre-charge voltage level. Namely, inactive sense amplifiers are not connected to the first data bus.

According to another aspect of the present invention, a direct-sense-amplifier scheme is employed to achieve reliable data-read operations, and, at the same time, a pre-charge voltage level of the sense amplifiers is set to a ground voltage. This achieves automatic separation of inactive sense amplifiers from the first data bus.

Other objects and further features of the present invention will be apparent from the following detailed description when read in conjunction with the accompanying drawings.

DESCRIPTION OF THE PREFERRED EMBODIMENTS

In the following, a principle and embodiments of the present invention will be described with reference to the accompanying drawings.

Figure 3:
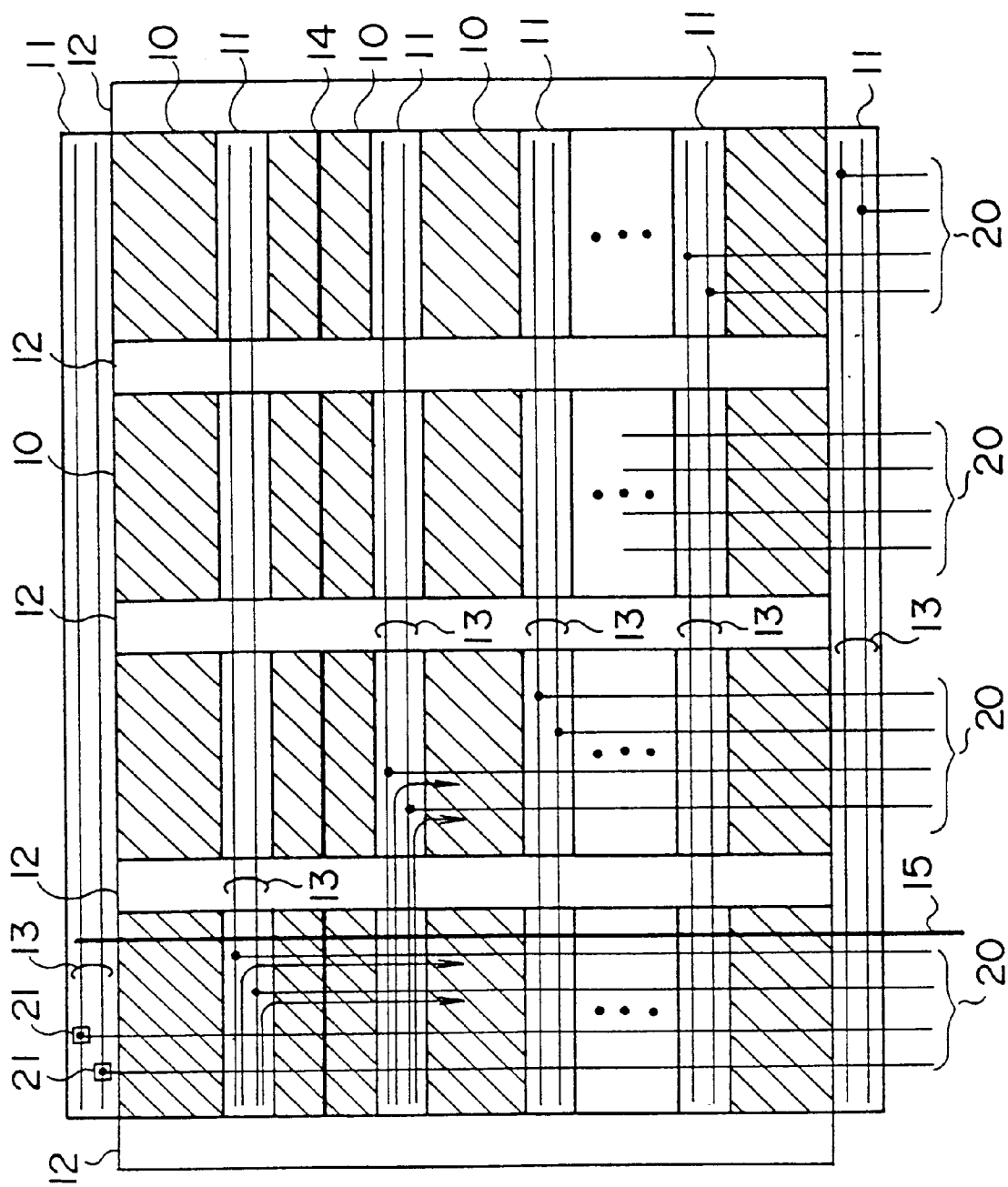
FIG. 3 is an illustrative drawing showing a layout of global data buses according to a principle of the present invention.

FIG. 3 is an illustrative drawing showing a layout of global data buses according to a principle of the present invention.

A core circuit of FIG. 3 includes cell blocks 10, sense-amplifier-line areas 11, sub-word-decoder-line areas 12, local data buses 13, word-selection line 14, column-selection line 15, and global-data buses 20. The cell blocks 10 are arranged in rows and columns, and include cell arrays. The sense-amplifier-line areas 11 are arranged on an upper side and a lower side of the cell blocks 10. The sub-word-decoder-line areas 12 are situated on a left-hand side and a right-hand side of the cell blocks 10. The local data buses 13 are laid out over the sense-amplifier-line areas 11. The word-selection line 14 selects one row of memory cells in the cell blocks 10. The column-selection line 15 selects some of the sense amplifiers (not shown) arranged in the sense-amplifier-line areas 11. The global-data buses 20 are used for reading/writing data with respect to the cell blocks 10.

The core circuit of FIG. 3 is implemented as a semiconductor device having a multi-layered structure like a core circuit of a related-art DRAM. The local data buses 13 and the sense amplifiers in the sense-amplifier-line areas 11 are arranged in a first wiring layer, and the column-selection line 15 is provided in a second wiring layer. In the present invention, the global-data buses 20 are laid out in the second wiring layer to extend over or under the cell blocks 10 having memory cells. The global-data buses 20 in the second wiring layer are connected to the local data buses 13 in the first wiring layer via contact holes (or hole burying layer) 21 without intervening switches. The contact holes 21 are shown in FIG. 3 only with respect to the sense-amplifier-line area 11 on the top of the figure for the sake of simplicity and clarity of the figure. Notwithstanding this, all the connections between the global-data buses 20 and the local data buses 13 are provided by the contact holes or the hole burying layer.

Operations of the core circuit of FIG. 3 will be described below by taking a data-read operation as an example. The word-selection line 14 is first selected from a plurality of word-selection lines (not shown) by word decoders (not shown) arranged in the sub-word-decoder-line areas 12. The selection of the word-selection line 14 is equivalent to selecting one row of the cell blocks 10 from the rows and columns of the cell blocks 10, and further selecting a row of memory cells from the cell arrays in the selected row of the cell blocks 10. Data stored in the selected memory cells is transferred via bit lines (not shown) to the sense amplifiers provided in the sense-amplifier-line areas 11 which are arranged on the upper side and the lower side of the selected cell blocks 10. The column-selection line 15 is selected from a plurality of column-selection lines (not shown) to choose some sense amplifiers from the plurality of sense amplifiers, which store the data transferred from the memory cells. The data is read from the selected sense amplifiers to the local data buses 13. The data is read via the global-data buses 20 which are directly connected to the local data buses 13 situated on the upper side and the lower side of the selected cell blocks 10.

In the present invention, as shown in FIG. 3, the global-data buses 20 are arranged to extend over the cell arrays of the cell blocks 10. This layout provides a sufficient space for accommodating the global-data buses 20, so that the volume of data transfer can be increased by incrementing the number of global data buses without enlarging a chip size. Further, each of the global-data buses 20 is directly connected to a corresponding one of local data buses 13, which makes it possible to achieve a high-speed data transfer by avoiding an unnecessary intervening resistance.

Figure 4:
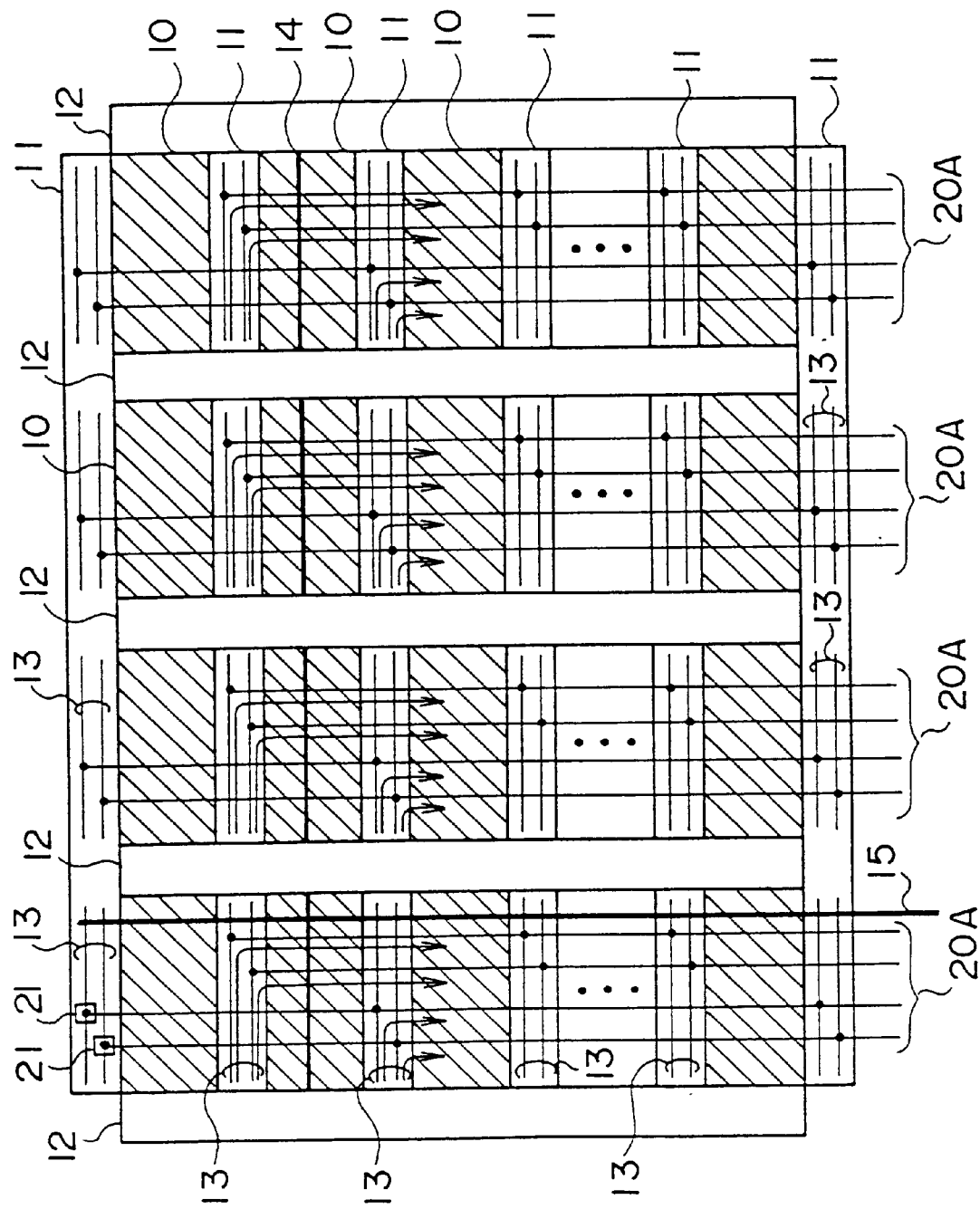
FIG. 4 is an illustrative drawing showing a variation of the layout of the global data buses according to the principle of the present invention.

FIG. 4 is an illustrative drawing showing a variation of the layout of the global data buses according to the principle of the present invention.

In FIG. 4, the same elements as those of FIG. 3 are referred to by the same numerals, and a description thereof will be omitted.

The layout of FIG. 4 differs from the layout of FIG. 3 mainly in that global-data buses 20A are connected to a respective set of the local data buses 13. In FIG. 4, each data line of the global-data buses 20A is connected to more than one of the local data buses 13, so that a function needs to be provided to selectively activate one of the local data buses 13. A description of this function will be provided later in connection with embodiments of the present invention.

In the layout of FIG. 3, one data line of the global-data buses 20 needs to be provided for each data line of the local data buses 13, so that data lines have one-to-one correspondences between the global-data buses 20 and the local data buses 13. Namely, the number of the global-data buses 20 is the same as the number of the local data buses 13. In this case, since the number of the global-data buses 20 is bound to be relatively large, an attempt to increase the number of the global-data buses 20 by increasing the number of the local data buses 13 may be foiled by a limitation of a chip space. In the layout of FIG. 4, one data line of the global-data buses 20A corresponds to many data lines of the local data buses 13, the number of the global-data buses 20A is much smaller than the number of the local data buses 13. This means that there is a sufficient chip space for accommodating an extra number of the global-data buses 20A. A large enhancement in the volume of data transfer, therefore, can be attainable in this case.

Figure 5:
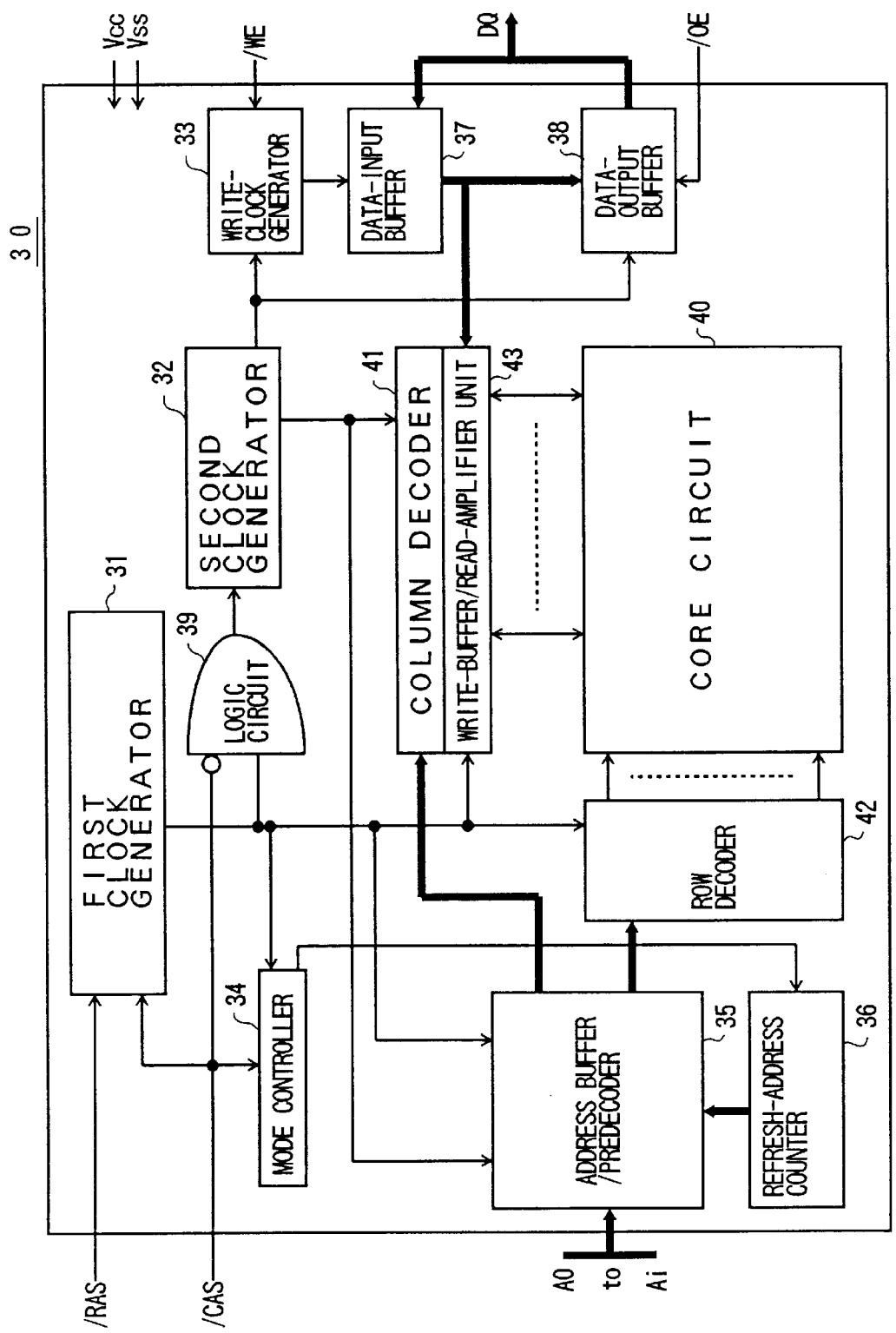
FIG. 5 is a block diagram of an example of a DRAM to which a layout of a core circuit is applied according to the present invention.

FIG. 5 is a block diagram of an example of a DRAM to which the layout of the core circuit is applied according to the present invention.

A DRAM 30 of FIG. 5 includes a first clock generator 31, a second clock generator 32, a write-clock generator 33, a mode controller 34, an address buffer/predecoder 35, a refresh-address counter 36, a data-input buffer 37, a data-output buffer 38, a logic circuit 39, a core circuit 40 having the layout of FIG. 3 or FIG. 4, a column decoder 41, a row decoder 42, and a write-buffer/read-amplifier unit 43.

The DRAM of FIG. 5 according to the present invention differs from a related-art DRAM only in the layout of the core circuit 40, and has operations which are the same as those of the related-art DRAM. In what follows, the operations of the DRAM of the present invention will be described with reference to FIG. 3, FIG. 4, and FIG. 5.

The first clock generator 31 receives a /RAS (row access strobe) signal and a /CAS (column access strobe) signal, and generates a first clock signal used for row access to the core circuit 40 when the /RAS signal is enable. When the /CAS signal is enable, the first clock signal generated by the first clock generator 31 is supplied to the second clock generator 32 via the logic circuit 39. Based on the first clock signal, the second clock generator 32 generates a second clock signal used for column access. The mode controller 34 controls the refresh-address counter 36 based on the /CAS signal and the first clock signal generated by the first clock generator 31. Under the control of the mode controller 34, the refresh-address counter 36 performs a refresh operation with respect to memory cells of the core circuit 40 via the address buffer/predecoder 35 and the row decoder 42.

In the case of data-read operations, address signals A0 through Ai are supplied to the address buffer/predecoder 35. The address signals are pre-decoded by the address buffer/predecoder 35, and pre-decoding results are provided to the row decoder 42. Operating in synchronism with the first clock signal from the first clock generator 31, the row decoder 42 further decodes the pre-decoding results so as to select the word-selection line 14 (FIG. 3 or FIG. 4). This achieves an access to a selected row (word) of the core circuit 40. Data of the selected row is transferred to sense amplifiers (not shown) of the core circuit 40. Receiving pre-decoding results from the address buffer/predecoder 35, the column decoder 41 selects the column-selection line 15 (FIG. 3 or FIG. 4) in synchronism with the second clock signal from the second clock generator 32. The data is read from the selected sense amplifier chosen by the column-selection line 15. The data is supplied to the write-buffer/read-amplifier unit 43 via the global-data buses 20 (FIG. 3) or the global-data buses 20A (FIG. 4).

The write-buffer/read-amplifier unit 43 amplifies the supplied data, and provide it to the data-output buffer 38. The data-output buffer 38 sends out the supplied data to the outside of the device as data DQ in synchronism with the second clock signal when an /OE (output enable) signal is enable.

In the case of data-write operations, the write-clock generator 33 generates an input clock signal in synchronism with the second clock signal supplied from the second clock generator 32 when a /WE (write enable) signal is enable. Data DQ externally provided is temporarily stored in the data-input buffer 37 in synchronism with the input clock signal. The data of the data-input buffer 37 is then transferred to the write-buffer/read-amplifier unit 43.

While the above operations are underway, address signals A0 through Ai are input to the address buffer/predecoder 35.

The address signals are pre-decoded by the address buffer/predecoder 35, and pre-decoding results are provided to the column decoder 41 and the row decoder 42. Operating in synchronism with the second clock signal, the column decoder 41 receives the pre-decoding results from the address buffer/predecoder 35, and selects the column-selection line 15 (FIG. 3 or FIG. 4) to choose sense amplifiers of the core circuit 40. The data of the write-buffer/read-amplifier unit 43 is then transferred to the selected sense amplifiers via the global-data buses 20 (FIG. 3) or 20A (FIG. 4). Operating in synchronism with the first clock signal, the row decoder 42 further decodes the pre-decoding results to select the word-selection line 14 (FIG. 3 or FIG. 4), thereby storing the data of the sense amplifiers to the memory cells.

Figure 6:
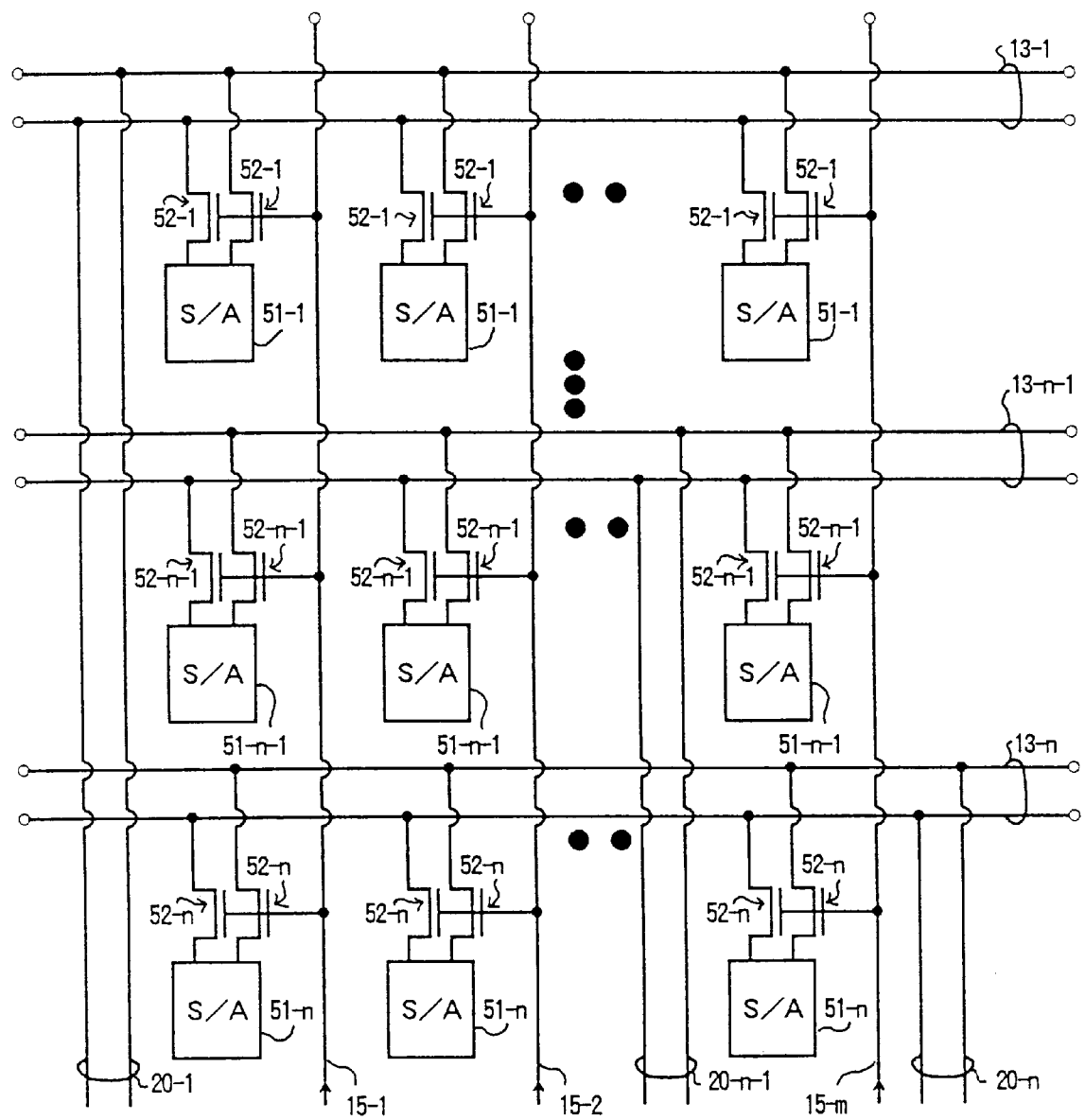
FIG. 6 is a circuit diagram of a first embodiment of sense amplifiers, column-selection lines, local data buses, and global data buses according to the present invention.

FIG. 6 is a circuit diagram of a first embodiment of sense amplifiers, column-selection lines, local data buses, and global data buses according to the present invention. The configuration of FIG. 6 corresponds to the layout of FIG. 3 in which the global data buses have a one-to-one correspondence to the local data buses.

In FIG. 6, a plurality of sense amplifiers 51-1 are arranged to form a line of sense amplifiers, and are connected to local data bus 13-1 via NMOS transistors 52-1. Likewise, a plurality of sense amplifiers 51-n-1 are arranged to form a line of sense amplifiers, and are connected to local data bus 13-n-1 via NMOS transistors 52-n-1. Further, a plurality of sense amplifiers 51-n are arranged to form a line of sense amplifiers, and are connected to local data bus 13-n via NMOS transistors 52-n. Gates of the NMOS transistors 52-1 through 52-n are connected to a corresponding one of column-selection lines 15-1 through 15-m. Each line of the sense amplifiers 51-1 through 51-n is arranged in the sense-amplifier-line areas 11 of FIG. 3, and is connected to the memory cells of the cell blocks 10 via bit lines and cell-gate transistors.

When one of the column-selection lines 15-1 through 15-m is selected, one of the sense amplifiers is selected in each line of the sense amplifiers 51-1 through 51-n to be connected to a corresponding one of the local data buses 13-1 through 13-n. The local data buses 13-1 through 13-n are directly connected to global data buses 20-1 through 20-n, respectively.

In the case of data-read operations, the cell blocks 10 (FIG. 3) corresponding to a line of sense amplifiers 51-1, for example, are selected by the word-selection line 14 (FIG. 3). Data of a selected row of memory cells is stored in the sense amplifiers 51-1. When one of the column-selection lines 15-1 through 15-m is selected to change to HIGH, a pair of the NMOS transistors 52-1 serving as column-gate transistors is selectively turned on. Via the selected pair of the NMOS transistors 52-1, data of the selected one of the sense amplifiers 51-1 is conveyed to the local data bus 13-1. The data on the local data bus 13-1 is then read out from the core circuit 40 via the global data bus 20-1 which has a direct connection with the local data bus 13-1.

In the case of data-write operations, data is supplied to the local data bus 13-n, for example, via the global data bus 20-n. When one of the column-selection lines 15-1 through 15-m is selectively changed to HIGH, a pair of the NMOS transistors 52-n serving as column-gate transistors is selectively turned on. Via the selected pair of the NMOS transistors 52-n, a selected one of the sense amplifiers 51-n receives and stores the data appearing on the local data bus 13-n. The data of the selected one of the sense amplifiers 51-n is then stored in a memory cell selected by the word-selection line 14 (FIG. 3).

Figure 7:
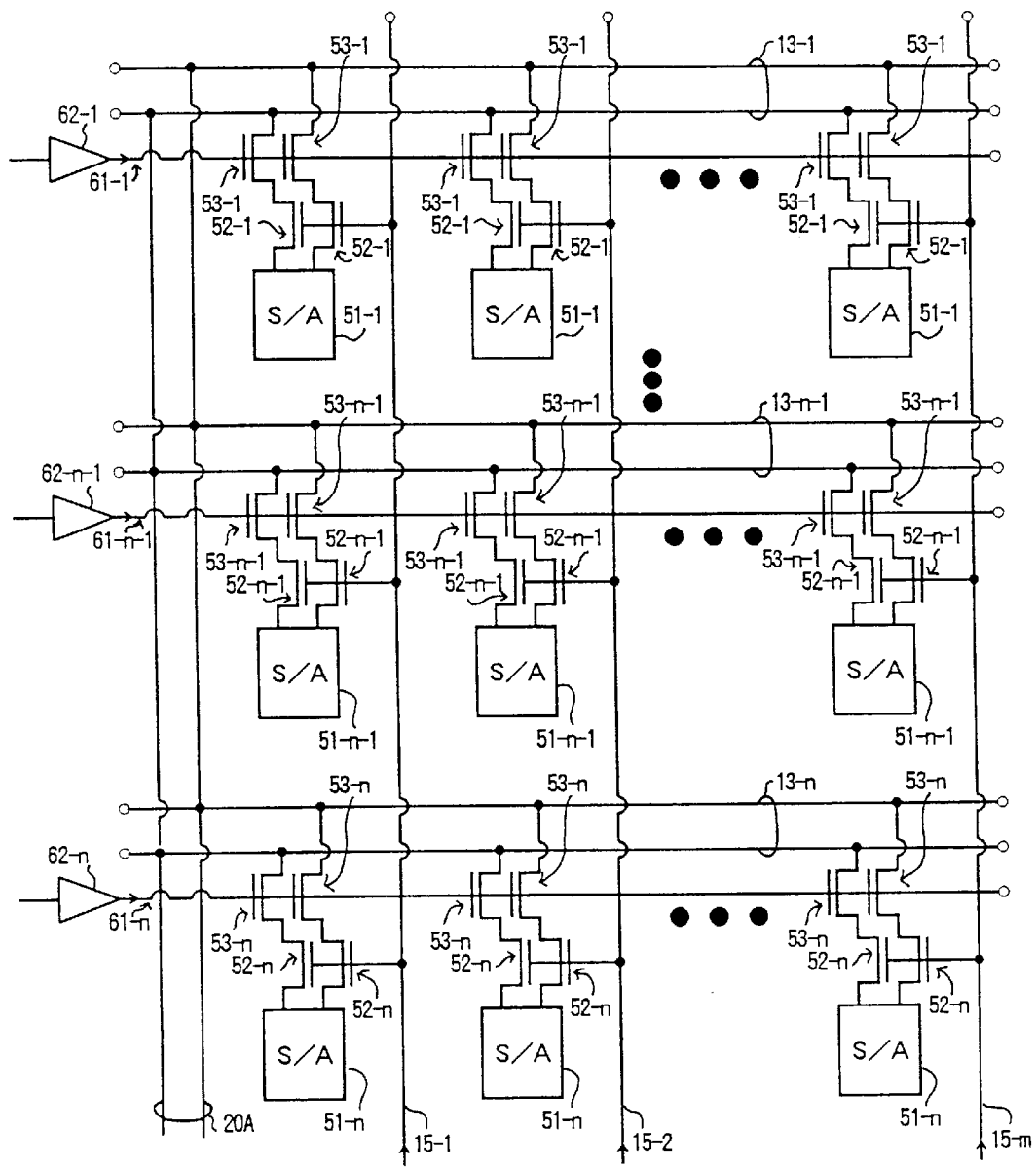
FIG. 7 is a circuit diagram of a second embodiment of sense amplifiers, column-selection lines, local data buses, and global data buses according to the present invention.

FIG. 7 is a circuit diagram of a second embodiment of sense amplifiers, column-selection lines, local data buses, and global data buses according to the present invention. The configuration of FIG. 7 corresponds to the layout of FIG. 4 in which the global data buses have one-to-many correspondences to the local data buses. In FIG. 7, the same elements as those of FIG. 6 are referred to by the same numerals, and a description thereof will be omitted.

In FIG. 7, the global-data bus 20A is directly connected to each of the local data buses 13-1 through 13-n. The plurality of sense amplifiers 51-1 are connected to the local data bus 13-1 via the NMOS transistors 52-1 and NMOS transistors 53-1. Likewise, the plurality of sense amplifiers 51-n-1 are connected to the local data bus 13-n-1 via the NMOS transistors 52-n-1 and NMOS transistors 53-n-1. Further, the plurality of sense amplifiers 51-n are connected to the local data bus 13-n via the NMOS transistors 52-n and NMOS transistors 53-n.

As previously described in connection with FIG. 4, the global-data bus 20A is directly connected to a plurality of the local data buses 13. In such a configuration, there is a need to provide a function to selectively activate one of the local data buses 13. In FIG. 7, drivers 62-1 through 62-n and sense-amplifier-selection lines 61-1 through 61-n are used for implementing this function.

The sense-amplifier-selection lines 61-1 through 61-n are connected to gates of the NMOS transistors 53-1 through 53-n, respectively. Each of the drivers 62-1 through 62-n drive a corresponding one of the sense-amplifier-selection lines 61-1 through 61-n.

Figure 1:
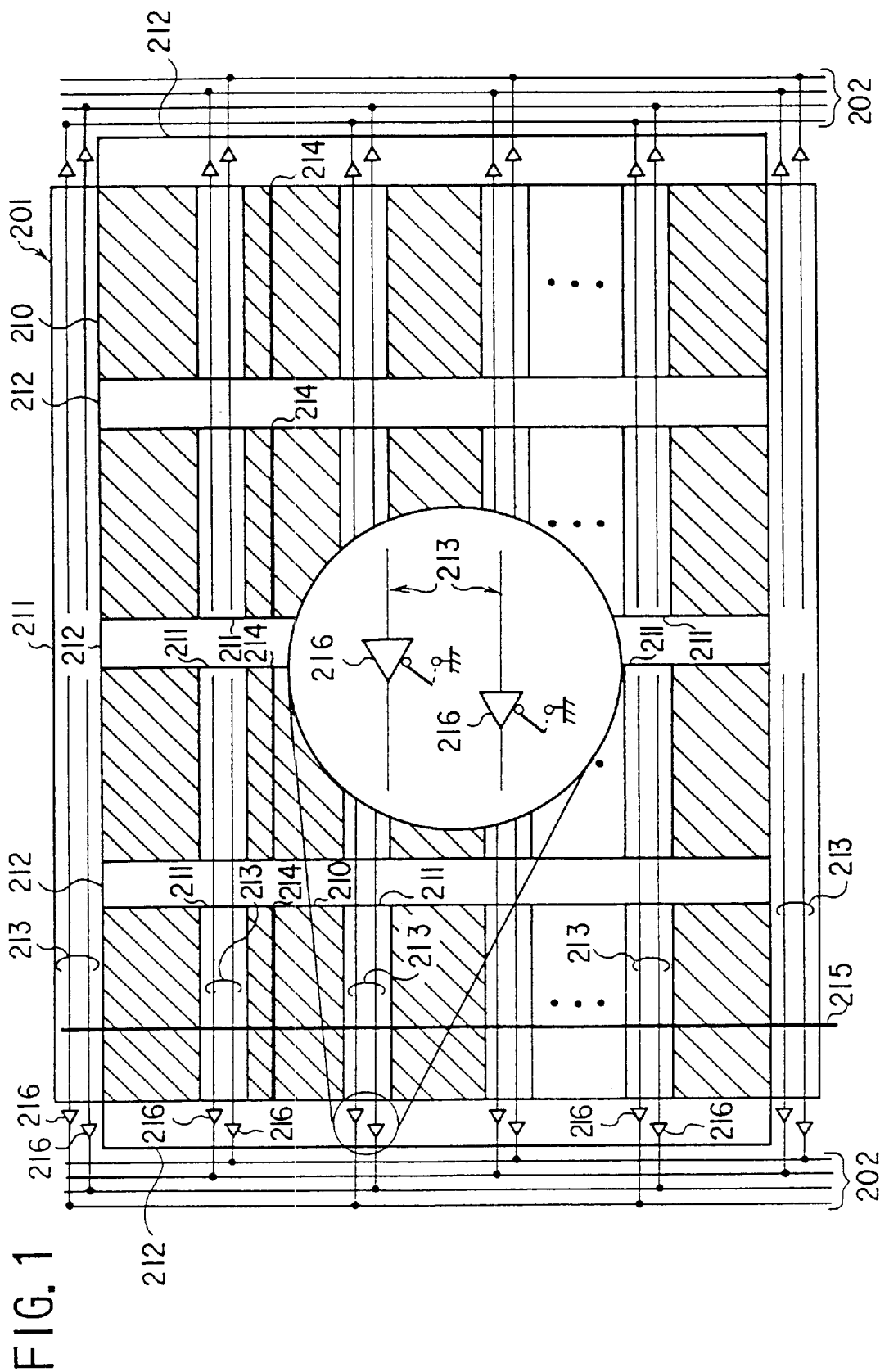
FIG. 1 is an illustrative drawing showing a layout of cell arrays and peripherals thereof with regard to a related-art DRAM.
Figure 2:
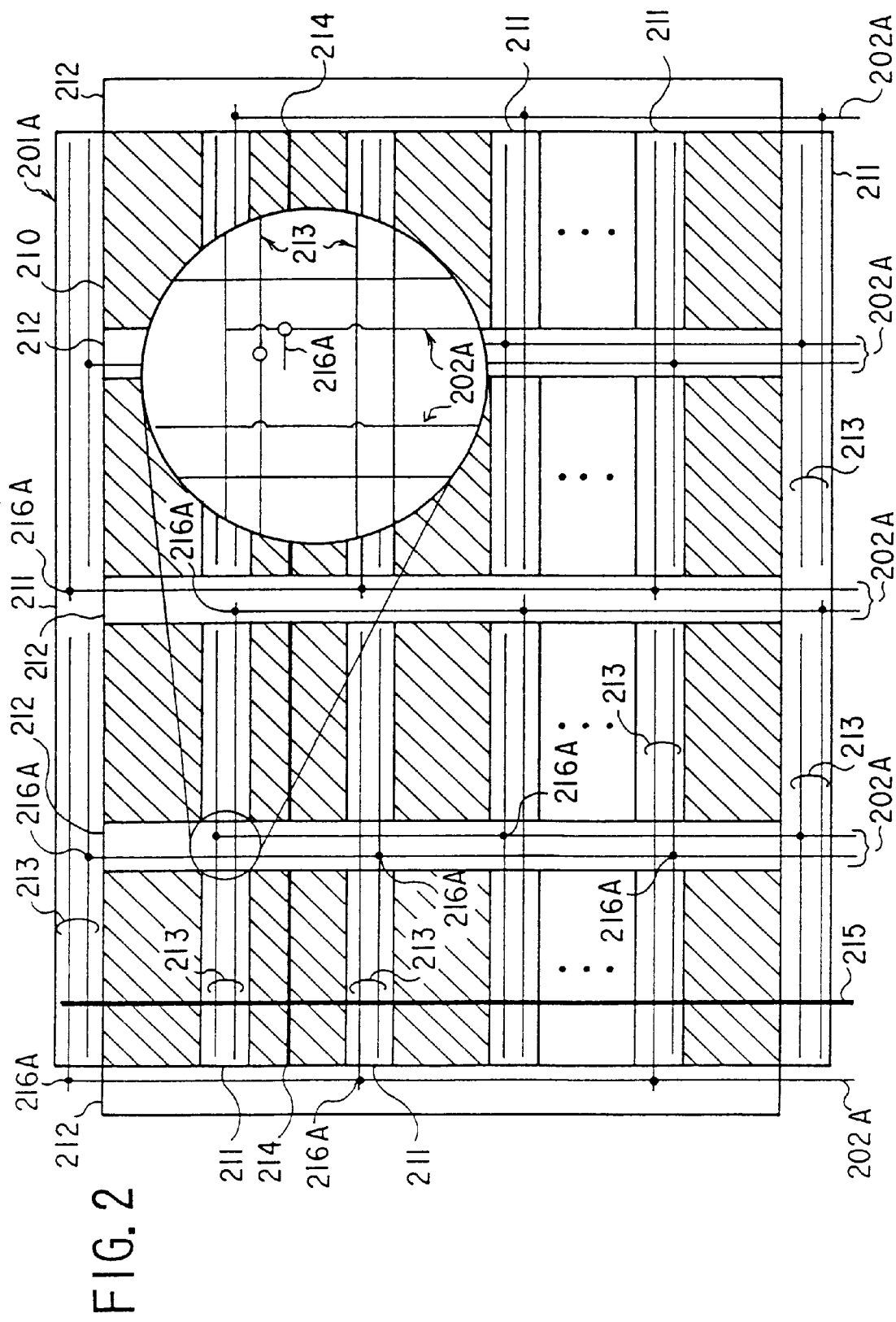
FIG. 2 is an illustrative drawing showing another layout of cell arrays and peripherals thereof with regard to a related-art DRAM.

The drivers 62-1 through 62-n are used for selecting two sense-amplifier lines of the sense-amplifier-line areas 11 (FIG. 4) arranged on the upper side and the lower side of a selected row of the cell blocks 10 when this row is selected by the word-selection line 14 (FIG. 4). The drivers 62-1 through 62-n are controlled by the row decoder 42 of FIG. 5 to change selected lines of the sense-amplifier-selection lines 61-1 through 61-n to HIGH, and these selected lines correspond to the selected sense-amplifier lines. Control of the drivers 62-1 through 62-n by the row decoder 42 is the same as that used in a related-art DRAM, and such control, for example, is used when the amplifier switches 216 in FIG. 1 need to be selectively turned on. A detailed description of this control will be omitted.

In the case of data-read operations, the cell blocks 10 (FIG. 3) corresponding to a line of the sense amplifiers 51-1, for example, are selected by the word-selection line 14 (FIG. 3). Data of a selected row of memory cells is stored in the sense amplifiers 51-1. The driver 62-1 then turns the sense-amplifier-selection line 61-1 to HIGH so as to turn on the NMOS transistors 53-1. When one of the column-selection lines 15-1 through 15-m is selected to change to HIGH, a pair of the NMOS transistors 52-1 is selectively turned on. Via the selected pair of the NMOS transistors 52-1 and a corresponding pair of the NMOS transistors 53-1, data of the selected one of the sense amplifiers 51-1 is conveyed to the local data bus 13-1. The data on the local data bus 13-1 is then read out from the core circuit 40 via the global data bus 20A which has a direct connection with the local data bus 13-1.

In the case of data-write operations, data is supplied to the local data buses 13-1 through 13-n via the global data bus 20A. Then, the driver 62-n, for example, turns the sense-amplifier-selection line 61-n to HIGH to turn on the NMOS transistors 53-n. When one of the column-selection lines 15-1 through 15-m is selectively changed to HIGH, a pair of the NMOS transistors 52-n is selectively turned on. Via the selected pair of the NMOS transistors 52-n and a corresponding pair of the NMOS transistors 53-n, a selected one of the sense amplifiers 51-n receives and stores the data appearing on the local data bus 13-n. The data of the selected one of the sense amplifiers 51-n is then stored in a memory cell selected by the word-selection line 14 (FIG. 3).

Figure 8:
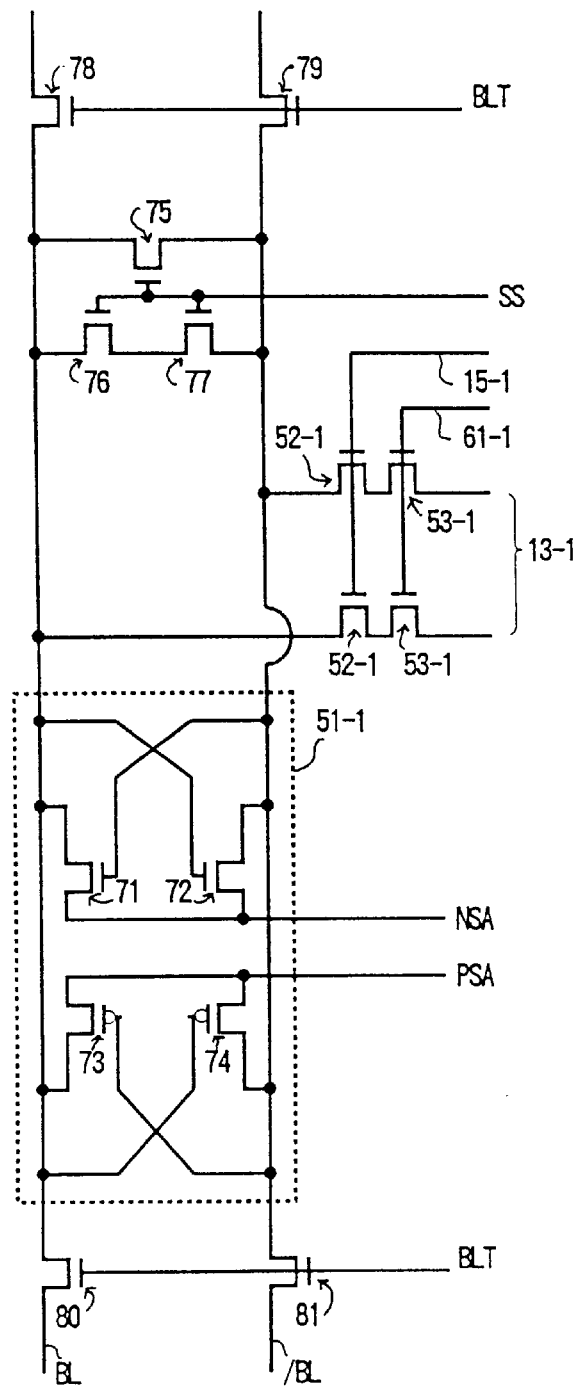
FIG. 8 is a circuit diagram showing relations between a sense amplifier and bit lines with regard to a configuration of FIG. 7.

FIG. 8 is a circuit diagram showing relations between a sense amplifier and bit lines with regard to the configuration of FIG. 7.

FIG. 8 takes one of the sense amplifiers 51-1 as an example, and shows a circuit configuration of the sense amplifier 51-1 and bit lines connected thereto. In FIG. 8, the same elements as those of FIG. 7 are referred to by the same numerals, and a description thereof will be omitted.

In FIG. 8, the sense amplifier 51-1 includes NMOS transistors 71 and 72 and PMOS transistors 73 and 74. The sense amplifier 51-1 is driven by the sense-amplifier driving signal NSA and PSA. The sense amplifier 51-1 amplifies data signals on bit lines BL and /BL when data is transferred from a memory cell (not shown) to the bit lines BL and /BL at the time of data-read operations. Also, the sense amplifier 51-1 holds data signals supplied to the bit lines BL and /BL from the local data bus 13-1 at the time of data-write operations.

NMOS transistors 75 through 77 together form a circuit for short-circuiting the bit lines BL and /BL with each other so as to bring the bit lines BL and /BL to the same voltage level. In detail, when a short signal SS is HIGH, the bit lines BL and /BL are short-circuited with each other. NMOS transistors 78 through 81 are gates intervening between the sense amplifier 51-1 and the memory cell, and connects the memory cell to the sense amplifier 51-1 via the bit lines BL and /BL when turned on by a HIGH state of a bit-line-transfer signal BLT.

A configuration identical to that of FIG. 8 is used for each of the sense amplifiers shown in FIG. 7, and allows data transfer to be conducted between each sense amplifier and a memory cell at the time of data-read/write operations.

Figure 9:
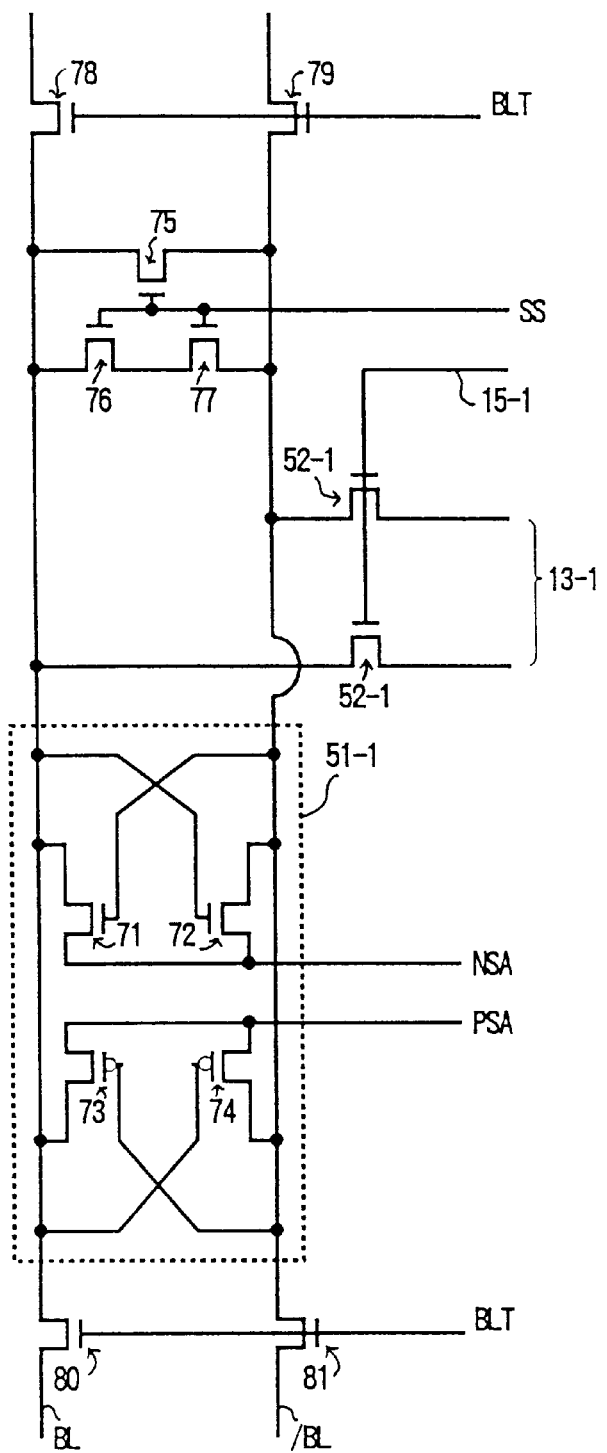
FIG. 9 is a circuit diagram of a variation of the second embodiment shown in FIG. 7 and FIG. 8.

FIG. 9 is a circuit diagram of a variation of the second embodiment shown in FIG. 7 and FIG 8. FIG. 9 corresponds to FIG. 8. In FIG. 9, the same elements as those of FIG. 8 are referred to by the same numerals, and a description thereof will be omitted.

A circuit of FIG. 9 is the same as that of FIG. 8, except that the NMOS transistors 53-1 and the sense-amplifier-selection line 61-1 of FIG. 8 are removed from the circuit of FIG. 9. Even in this configuration of FIG. 9, the bit lines BL and /BL can be prevented from being connected to the local data bus 13-1 when the sense amplifier 51-1 is inactive. As will be described below, this is achieved by setting the column-selection line 15-1 to an appropriate voltage level when this column is selected.

The bit lines BL and /BL and the local data bus 13-1 are pre-charged to a predetermined voltage VPP in preparation for data-read/write operations in the same manner as in a conventional DRAM. The pre-charge voltage VPP is ½ VCC, for example, where VCC is a power voltage. In an example of FIG. 9, when the column-selection line 15-1 is selected, a voltage level supplied to the column-selection line 15-1 is set to a voltage VCL lower than the pre-charge voltage VPP.

When the sense amplifier 51-1 is inactive, no data is held by the sense amplifier 51-1, and the bit lines BL and /BL remain at the pre-charge voltage VPP. Even if the column-selection line 15-1 is selected in this case, the NMOS transistors 52-1 are not turned on since the voltage VCL of the column-selection line 15-1 is lower than the pre-charge voltage VPP. The bit lines BL and /BL are thus not coupled to the local data bus 13-1.

When the sense amplifier 51-1 is active, the sense amplifier 51-1 holds data, and the voltage levels of the bit lines BL and /BL are the power voltage VCC and a ground voltage VSS, respectively. When the column-selection line 15-1 is selected, one of the NMOS transistors 52-1 is turned on since the voltage VCL of the column-selection line 15-1 is higher than the ground voltage VSS. The data on the bit lines BL and /BL in this case appear on the local data bus 13-1.

As described above, the configuration of FIG. 9 sets a voltage used for selecting a column-selection line to an appropriate voltage level rather than providing the sense-amplifier-selection lines, and, by doing so, prevents inactive sense-amplifier lines from being connected to the global data bus even through the plurality of local data buses are connected to the global data bus. In FIG. 9, the voltage VCL of the column-selection line 15-1 when this line is selected needs to be lower than VPP+Vth to be exact, where VPP is the pre-charge voltage and Vth is a threshold voltage of the NMOS transistors 52-1.

Figure 10:
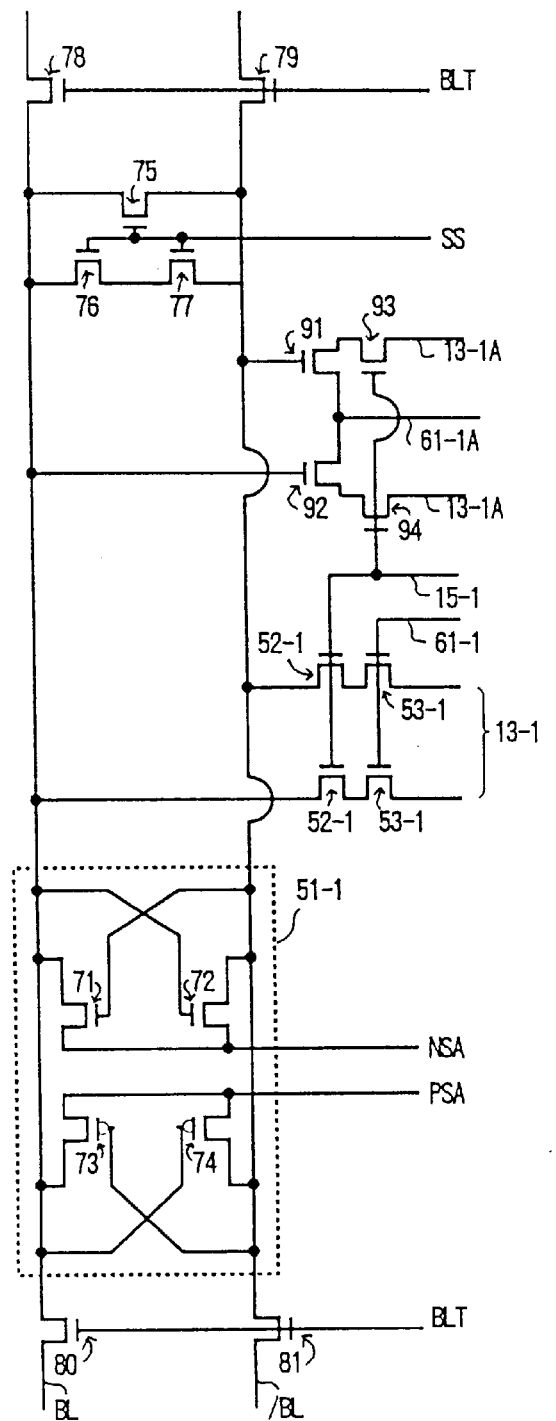
FIG. 10 is a circuit diagram of a third embodiment of a configuration of a sense amplifier, a column-selection line, and a local data bus of a core circuit shown in FIG. 5.

FIG. 10 is a circuit diagram of a third embodiment of a configuration of a sense amplifier, a column-selection line, and a local data bus of the core circuit 40 shown in FIG. 5. The configuration of FIG. 10 corresponds to the layout of FIG. 4 in which one global data bus is connected to many local data buses. FIG. 10 shows a circuit portion which is equivalent to that of FIG. 8. In FIG. 10, the same elements as those of FIG. 8 are referred to by the same numerals, and a description thereof will be omitted.

A circuit of FIG. 10 differs from that of FIG. 8 only in that a data-read circuit comprised of NMOS transistors 91 through 94 is additionally provided. The configuration of FIG. 10 employs a direct-sense-amplifier scheme used in the related art as can be seen in that gates of the NMOS transistors 91 and 92 are connected to the bit lines BL and /BL. Further, a local data bus 13-1A used for data-read operations is connected to drains of the NMOS transistors 91 and 92 via the NMOS transistors 93 and 94, which are controlled by the column-selection line 15-1. Sources of the NMOS transistors 91 and 92 are connected to a-sense-amplifier-selection line 61-1A used for data-read operations.

At the time of a data-read operation, the sense-amplifier-selection line 61-1A is selected and changed to LOW. When the column-selection line 15-1 is selectively turned to HIGH, the NMOS transistors 93 and 94 are turned on, so that the local data bus 13-1A is electrically connected to the bit lines BL and /BL via the NMOS transistors 91 and 92. In this case, the sources of the NMOS transistors 91 and 92 are at a LOW level. When the bit line BL is HIGH, for example, the NMOS transistor 92 is turned on, so that a current flows from a line of the local data bus 13-1A connected with the NMOS transistor 92 to the LOW level. That is, this line of the local data bus 13-1A is changed to a LOW level. The bit line /BL is LOW in this case, so that the NMOS transistor 91 is not turned on. Because of this, a current does not flow from a line of the local data bus 13-1A connected with the NMOS transistor 91.

It should be noted that the pre-charge voltage VPP of the bit-lines BL and /BL may be set at half the power voltage VCC, i.e., at a ½-VCC voltage level in the configuration of FIG. 10, as normally practiced in conventional DRAMs. When the sense-amplifier-selection line 61-1A is selectively changed to LOW, which is lower than the ½-VCC voltage level, the NMOS transistors 91 and 92 are turned on or off in accordance with voltage levels of the bit-lines BL and /BL, so that the local data bus 13-1A is electrically connected to the sense-amplifier-selection line 61-1A. On the other hand, when the sense-amplifier-selection line 61-1A is kept at the HIGH level, which is higher than the ½-VCC voltage level, the NMOS transistors 91 and 92 maintain an off-state thereof at all times, thereby keeping the local data bus 13-1A separated from the sense-amplifier-selection line 61-1A.

In this manner, the data held by the sense amplifier 51-1 is read out to the local data bus 13-1A. In the configuration described in the above, the bit lines BL and /BL are not directly connected to the local data bus 13-1A, but control an on/off state of the NMOS transistors 91 and 92 to drive the local data bus 13-1A for the purpose of data transfer. Because of this, even when the load of the local data bus 13-1A is heavy, the data held by the sense amplifier 51-1 will not be affected by the load, unlike the case in which the local data bus 13-1A is directly connected to the bit lines BL and /BL. A reliable data-read operation can thus be achieved.

Like the sense-amplifier-selection lines 61-1 through 61-n of FIG. 7, the sense-amplifier-selection line 61-1A is provided for each of the sense amplifier lines from the sense amplifiers 51-1 to the sense amplifiers 51-n. By the same token, the local data bus 13-1A is provided with respect to each sense-amplifier line as in the case of the local data buses 13-1 through 13-n of FIG. 7.

Figure 11:
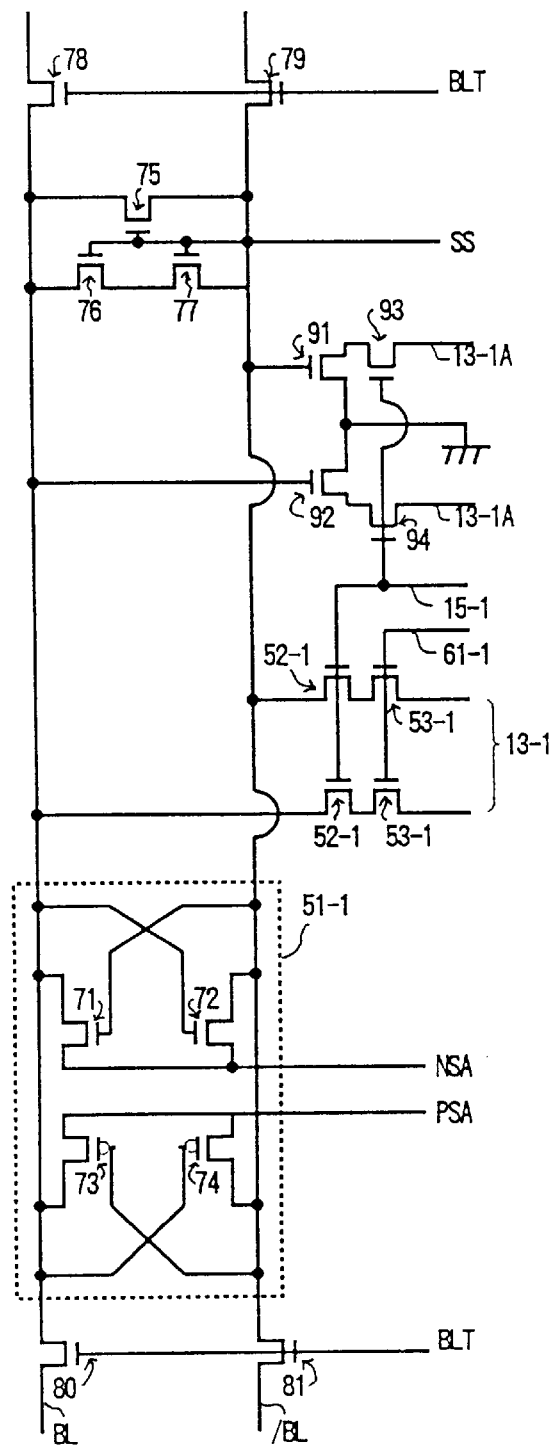
FIG. 11 is a circuit diagram of a variation of the third embodiment shown in FIG. 10.

FIG. 11 is a circuit diagram of a variation of the third embodiment shown in FIG. 10. In FIG. 11, the same elements as those of FIG. 10 are referred to by the same numerals, and a description thereof will be omitted.

A circuit of FIG. 11 differs from the circuit of FIG. 10 only in that a portion corresponding to the sense-amplifier-selection line 61-1A of FIG. 10 is connected to the ground voltage VSS. In the configuration of FIG. 11, the bit lines BL and /BL can be prevented from being connected to the local data bus 13-1A when the sense amplifier 51-1 is inactive. As will be described below, this is achieved by setting the pre-charge voltage VPP of the bit lines BL and /BL to the ground voltage VSS.

When the sense amplifier 51-1 is inactive, no data is held by the sense amplifier 51-1, and the bit lines BL and /BL remain at the pre-charge voltage VSS. Since the gate voltage level is the same as the source voltage level with regard to the NMOS transistors 91 and 92, the NMOS transistors 91 and 92 are not turned on. Even if the column-selection line 15-1 is selected, therefore, data on the bit lines BL and /BL does not appear on the local data bus 13-1.

When the sense amplifier 51-1 is active, the sense amplifier 51-1 holds data, and the voltage levels of the bit lines BL and /BL are the power voltage VCC and a ground voltage VSS, respectively. In this case, the NMOS transistor 92 is turned on. When the column-selection line 15-1 is selected, therefore, data on the bit lines BL and /BL appears on the local data bus 13-1.

As described above, the configuration of FIG. 11 sets the pre-charge voltage VPP to an appropriate voltage level rather than providing the sense-amplifier-selection lines, and, by doing so, prevents inactive sense-amplifier lines from being connected to the global data bus even through the plurality of local data buses are connected to the global data bus. In FIG. 9, the pre-charge voltage VPP needs to be lower than VSS+Vth to be exact, where VSS is the ground voltage and Vth is a threshold voltage of the NMOS transistors 91 and 92.

Further, the present invention is not limited to these embodiments, but various variations and modifications may be made without departing from the scope of the present invention.

What is claimed is:

1. A semiconductor memory device comprising:
   at least one cell block including an array of memory cells;
   a plurality of sense amplifiers which temporarily hold data of said memory cells;
   a first data bus connected to said plurality of sense amplifiers via first gates; and
   a second data bus having a direct electrical connection to said first data bus and being laid out to extend through a position of said at least one cell block.

2. The semiconductor memory device as claimed in claim 1, wherein said first data bus is arranged in a first wiring layer and said second data bus is arranged in a second wiring layer different from said first wiring layer, said first data bus and said second data bus being connected via one of contact holes or a hole burying layer.

3. The semiconductor memory device as claimed in claim 2, further comprising first selection lines which selectively connect said memory cells to said plurality of sense amplifiers, wherein said first selection lines are arranged in said first wiring layer to extend perpendicularly to said second data bus arranged in said second wiring layer.

4. The semiconductor memory device as claimed in claim 3, further comprising second selection lines which selectively open said first gates to connect said plurality of sense amplifiers selectively to said first data bus.

5. The semiconductor memory device as claimed in claim 1, further comprising a plurality of sense-amplifier lines each one of which is equivalent to said plurality of sense amplifiers and temporarily holds data of said memory cells, a plurality of first data buses each one of which is equivalent to said first data bus and corresponds to a respective one of said plurality of sense-amplifier lines, and a plurality of second data buses each one of which is equivalent to said second data bus and has a direct electrical connection to a corresponding one of said plurality of first data buses.

6. The semiconductor memory device as claimed in claim 1, further comprising a plurality of sense-amplifier lines each one of which is equivalent to said plurality of sense amplifiers and temporarily holds data of said memory cells, and further comprising a plurality of first data buses each one of which is equivalent to said first data bus and corresponds to a respective one of said plurality of sense-amplifier lines, wherein said second data bus has a direct electrical connection to each of said plurality of first data buses.

7. The semiconductor memory device as claimed in claim 4, further comprising a plurality of sense-amplifier lines each one of which is equivalent to said plurality of sense amplifiers and temporarily holds data of said memory cells, and further comprising a plurality of first data buses each one of which is equivalent to said first data bus and corresponds to a respective one of said plurality of sense-amplifier lines, wherein said second data bus has a direct electrical connection to each of said plurality of first data buses.

8. The semiconductor memory device as claimed in claim 7, further comprising third selection lines which select at least one of said plurality of sense-amplifier lines so as to enable data transfer to be conducted between said at least one of said plurality of sense-amplifier lines and a corresponding one of said plurality of first data buses.

9. The semiconductor memory device as claimed in claim 8, wherein said third selection lines are arranged in said first wiring layer, and said selection lines are arranged in said second wiring layer.

10. The semiconductor memory device as claimed in claim 8, further comprising second gates controlled by said third selection lines, wherein said second gates are connected in series with said first gates between a given one of said plurality of sense-amplifier lines and a corresponding one of said plurality of first data bus.

11. The semiconductor memory device as claimed in claim 10, wherein each of said plurality of first data buses includes a data-read bus and a data-write bus, and wherein said first gates and said second gates relating to said data-write bus include transistors respectively having said second selection lines and said third selection lines as a gate input thereof, said second gates relating to said data-read bus including transistors which are driven by said plurality of sense amplifiers and placed between said first gates and said third selection lines, and said first gates including transistors having said second selection lines as an gate input thereof.

12. The semiconductor memory device as claimed in claim 7, wherein said first gates include NMOS transistors, said second selection lines having a voltage level thereof generally lower than a pre-charge voltage level of said plurality of sense amplifiers when said second selection lines selectively turn on said first gates.

13. The semiconductor memory device as claimed in claim 7, wherein said plurality of first data buses include data-read buses and data-write buses, said semiconductor memory device further comprising:

third selection lines which select at least one of said plurality of sense-amplifier lines so as to enable data transfer to be conducted between said at least one of said plurality of sense-amplifier lines and a corresponding one of said data-write buses; and NMOS transistors which are driven by said plurality of sense amplifiers and have a source node thereof and a drain node thereof, said source node being connected to a ground voltage and said drain node being connected to said data-read buses via said first gates, wherein said sense amplifiers have a pre-charge voltage level thereof substantially equal to said ground voltage.

14. A semiconductor memory device comprising:

a plurality of sense-amplifier lines each including a plurality of sense amplifiers which temporarily hold data of memory cells;

a plurality of first data buses each provided with respect to a corresponding one of said plurality of sense-amplifier lines and connected to said plurality of sense amplifiers; and at least one second data bus having a direct electrical connection to said plurality of first data buses and being laid out to extend through a position of said memory cells.

\* \* \* \* \*